(12) United States Patent
Perner et al.

(10) Patent No.: US 6,584,589 B1
(45) Date of Patent: Jun. 24, 2003

(54) SELF-TESTING OF MAGNETO-RESISTIVE MEMORY ARRAYS

(75) Inventors: Frederick A. Perner, Palo Alto, CA (US); Kenneth J. Eldredge, Boise, ID (US); Lung Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/498,588

(22) Filed: Feb. 4, 2000

(51) Int. Cl.[7] .............................. G11C 29/00; G11C 7/00
(52) U.S. Cl. ........................................ 714/721; 365/201
(58) Field of Search .............................. 714/719, 721; 365/200, 201

(56) References Cited

U.S. PATENT DOCUMENTS

| | | | |
|---|---|---|---|
| 3,655,959 A | | 4/1972 | Chernow et al. |
| 3,712,537 A | | 1/1973 | Carita |
| 4,236,231 A | * | 11/1980 | Taylor .......................... 365/163 |
| 4,718,042 A | | 1/1988 | Moll et al. |
| 5,117,426 A | * | 5/1992 | McAdams ...................... 714/721 |
| 5,179,537 A | * | 1/1993 | Matsumoto ................. 365/185.21 |
| 5,233,614 A | * | 8/1993 | Singh ........................... 714/723 |
| 5,420,819 A | * | 5/1995 | Pohm ........................... 365/158 |
| 5,636,159 A | * | 6/1997 | Pohm ........................... 365/158 |
| 5,640,343 A | * | 6/1997 | Gallagher et al. .............. 365/171 |
| 5,930,164 A | | 7/1999 | Zhu |
| 5,952,833 A | | 9/1999 | Morgan |
| 6,097,625 A | * | 8/2000 | Scheuerlein .................. 365/171 |
| 6,115,763 A | * | 9/2000 | Douskey et al. ................ 710/72 |
| 6,259,644 B1 | * | 7/2001 | Tran et al. ..................... 365/209 |

FOREIGN PATENT DOCUMENTS

JP 57191900 11/1982

* cited by examiner

Primary Examiner—Albert Decady
Assistant Examiner—Joseph D. Torres

(57) ABSTRACT

A collection of testing circuits are disclosed which can be used to form a comprehensive built-in test system for MRAM arrays. The combination of testing circuits can detect MRAM array defects including: open rows, shorted memory cells, memory cells which are outside of resistance specifications, and simple read/write pattern errors. The built-in test circuits include a wired-OR circuit connecting all the rows to test for open rows and shorted memory cells. A dynamic sense circuit detects whether the resistance of memory cells is within specified limits. An exclusive-OR gate combined with global write controls is integrated into the sense amplifiers and is used to perform simple read-write pattern tests. Error data from the margin tests and the read-write tests are reported through a second wired-OR circuit. Outputs from the two wired-OR circuits and the associated row addresses are reported to the test processor or recorded into an on-chip error status table.

17 Claims, 6 Drawing Sheets

SELF-TESTING OF MAGNETO-RESISTIVE MEMORY ARRAYS

FIELD OF THE INVENTION

The present invention relates to the testing of memory circuits, and in particular to built-in self test circuitry for magneto-resistive memory (MRAM) arrays.

BACKGROUND OF THE INVENTION

In the production of large and complex integrated circuits one of the important considerations is the testability of the circuit. Because of flaws and inaccuracies which can affect the integrated circuits during fabrication it is important to be able to test the fabricated circuits before they are dispatched for use, so that faulty IC's can be discarded or, in some instances, corrected. Often such testing is performed by external circuitry, however the efficiency of testing can be increased if testing circuitry is included in the IC. This is referred to a built-in self test circuitry.

The documents referred to below describe some techniques for built-in self test in large scale integrated circuits.

1. M. Abramovici, et al; Digital Systems Testing and Testable Design; Chapter 9: "Design for testability"; Rockville, Md.; Computer Science Press; 1990
2. E. B. Eichelberger & T. W. Williams; "A Logic Design Structure for LSI Testability"; Journal of Design Automation and Fault Tolerant Computing; Vol. 2, pp 165–178, May 1978
35. Dasqupta, et al; "A variation of LSSD and its Implementation in Design and Test Pattern Generation in VLSI"; Proc. IEEE ITC; 1982; pp 63–66

Built-in self testing of memory circuits can be particularly advantageous because a large number of test vectors may be required in order to test a large memory array, which can involve substantial testing time for external circuitry. One of the testing procedures which is useful for memory arrays such as DRAM and SRAM is referred to as a pattern test, where a predetermined pattern (e.g. a checkerboard pattern) of data is written to the array and then the array is read to determine if the retrieved data matches the pattern that was written.

A new form of memory array which is being developed is referred to as magnetic random access memory (MRAM), and has the potential to be fabricated in arrays having storage capacities of many giga-bits. Because of the structure of MRAM elements and arrays, the size of the arrays and the data I/O structure thereof, built-in self test circuits which have been developed for SRAM and DRAM are inapplicable or insufficient for the purposes of MRAM.

SUMMARY OF THE INVENTION

In accordance with the principles of the present invention, there is provided a built-in self testing system for a magneto-resistive memory array integrated circuit including a first resistance specification testing circuit coupled to the bitlines of the memory array for testing the resistance of each memory cell in the memory array to determine if the resistance thereof is within predetermined upper and lower limits.

Preferably the resistance specification testing circuit compares a signal generated from each respective memory cell with first and second predetermined timing signals representing the predetermined upper and lower memory cell resistance specification limits.

In the preferred form of the invention the resistance specification testing circuit is incorporated in sense amplifier circuitry of the integrated circuit. The resistance specification testing circuit may include a charge integrating circuit arranged to integrate charge according to sensing current through a memory cell under test. A threshold circuit may be coupled to provide a binary output from the integrating element, and a switching circuit can be coupled to provide the binary output to a scan register of the sense amplifier in accordance with the first and second predetermined timing signals. The contents of the scan register can then be used to indicate whether the memory cell passes or fails the resistance specification test.

A second testing circuit may be coupled to the rows of memory cells in the memory array and arranged to detect shorted memory cells and open row addressing lines in the respective array rows. Preferably the second testing circuit comprises a wired-OR circuit coupled with the memory array rows to provide input and coupled to provide output to a row error flag register which records if any shorted cell or open row addressing line is detected in the memory array.

A third testing circuit may be coupled to a scan register of the memory array and arranged to write a predetermined data pattern into the memory array, read out data from the memory array, and compare the data read out with the data written in.

In a preferred form of the invention the third testing circuit is coupled with the first testing circuit through a wired-OR circuit to combine the outputs thereof into an error flag column register. The error flag column register can be used to record a number of errors detected by the first and third testing circuits for each row in the memory array in order to determine if the number of errors for each respective row is greater than a predetermined permissible number.

In accordance with the present invention there is also provided a built-in self testing system for a magneto-resistive random access memory (MRAM) integrated circuit having an array of memory cells, the memory cells each coupled between a respective row line and column line of the array, with sense amplifiers being coupled to the column lines of the array to sense data stored in the memory cells and a scan register coupled to receive output from the sense amplifiers and provide input for the memory cells in the array. The built-in self-testing system includes a first testing circuit comprising a resistance specification testing circuit coupled to the respective sense amplifiers for testing the resistance of each memory cell in the memory array to determine if the resistance thereof is within predetermined upper and lower limits. The built-in self testing system in this case also includes a second testing circuit coupled to the row lines of the memory array for detecting shorted memory cells and open row addressing lines in the respective array rows. This form of the built-in self testing system further includes a third testing circuit coupled to the scan register of the memory array and arranged to write a predetermined data pattern into the memory array, read out data from the memory array, and compare the data read out with the data written in.

A preferred form of the built-in self testing system further includes a testing state machine circuit coupled to control the first, second and third testing circuits to carry out respective first, second and third tests on the memory array.

Preferably the first and second predetermined timing signals are generated by said testing state machine circuit.

In accordance with another form of the invention there is provided a method for providing a built-in self testing capability for a magneto-resistive random access memory (MRAM) integrated circuit having an array of memory cells with at least one sense amplifier for sensing data stored in the memory cells. The method includes the steps of: using the sense amplifier to generate a current signal representing a sensing current through a memory cell in the array; time integrating the current signal and applying a threshold thereto to produce a binary output; sampling the binary output at first and second times; and registering the memory cell as outside predetermined resistance specifications based on the first and second sampled binary outputs.

The preferred embodiments of the present invention provide several advantages over the prior art. For example, conventional memory testing will require a significant time to test each chip that will result in making the MRAM test costs relatively high. Built-in self tests as found on SRAM and DRAM chips can be used to reduce testing time, but are limited to pattern tests and do not consider the special test requirements of MRAM arrays. This embodiments of the present invention utilize the write data and read data sense circuits found in MRAM arrays to create a wide range of built-in self test features which takes advantage of the block organization of the MRAM data. The scan data I/O registers are used store single bit error data that may be used to determine if the number of errors are ECC correctable or if the entire row of data needs to be marked as BAD. The circuits in this invention, when operated with a simple built-in 'test' state machine, will provide a complete range of tests and error reports for efficient MRAM array testing. The built-in self tests could be done at manufacture test and/or repeated by the user during reformatting procedures.

BRIEF DESCRIPTION OF THE DRAWINGS

The invention is described in greater detail hereinafter, by way of example only, through description of a preferred embodiment thereof and with reference to the accompanying drawings in which.

DETAILED DESCRIPTION OF THE PREFERRED EMBODIMENT

A method and apparatus for testing memory circuits is disclosed herein. In the following description, for purposes of explanation, specific nomenclature and specific implementation details are set forth to provide a thorough understanding of the present invention. However, it will be apparent to one skilled in the art that these specific details are not required in order to practice the present invention.

Figure 1:
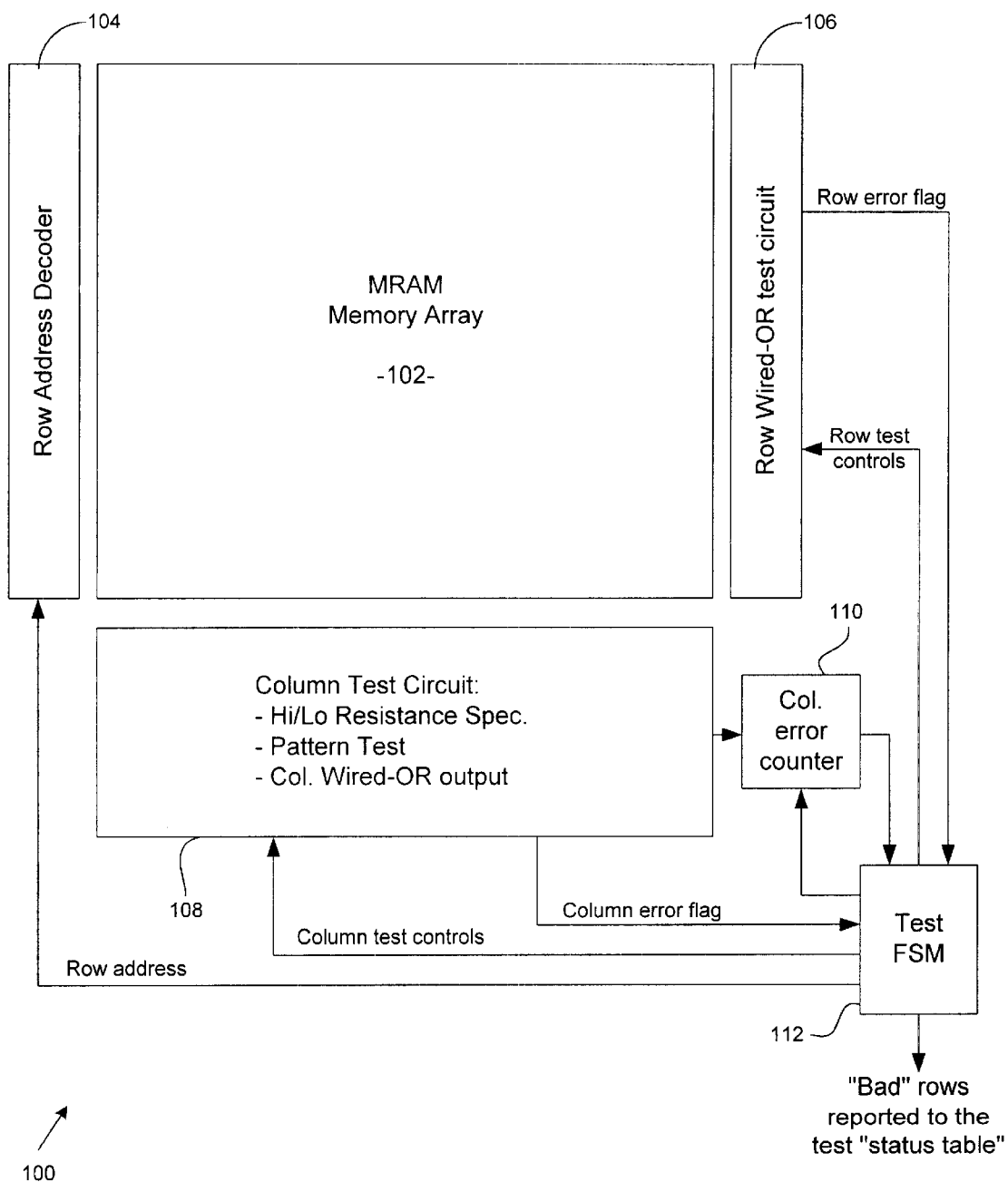
FIG. 1 is a system block diagram of an MRAM array including built-in self test circuitry according to an embodiment of the present invention.

An MRAM system 100 is shown in block diagram form in FIG. 1, having an MRAM array 102 and including built-in self test circuitry according to an embodiment of the present invention. A row wired-OR test circuit 106 is coupled to the output lines of the respective rows of memory elements in the array 102, which are addressed by means of a row address decoder 104 in known manner. A column test circuit coupled to the array 102 is shown at 108, which includes a Hi/Lo resistance specification tester, a pattern test circuit and a column wired-OR output. The column test circuit 108 is coupled to provide output to a column error counter 110. The row test circuit 106, column test circuit 108 and column error counter 110 are all coupled to a test function state machine 112, which is also coupled to enable control of the row address decoder 104. The preferred implementation of the present invention incorporates several aspects that can be utilized to form a comprehensive built-in self test system for MRAM memory arrays. The various aspects of the preferred embodiments are described in detail hereinbelow, from which a greater understanding of the functions of the circuits of FIG. 1 can be ascertained.

Figure 2:
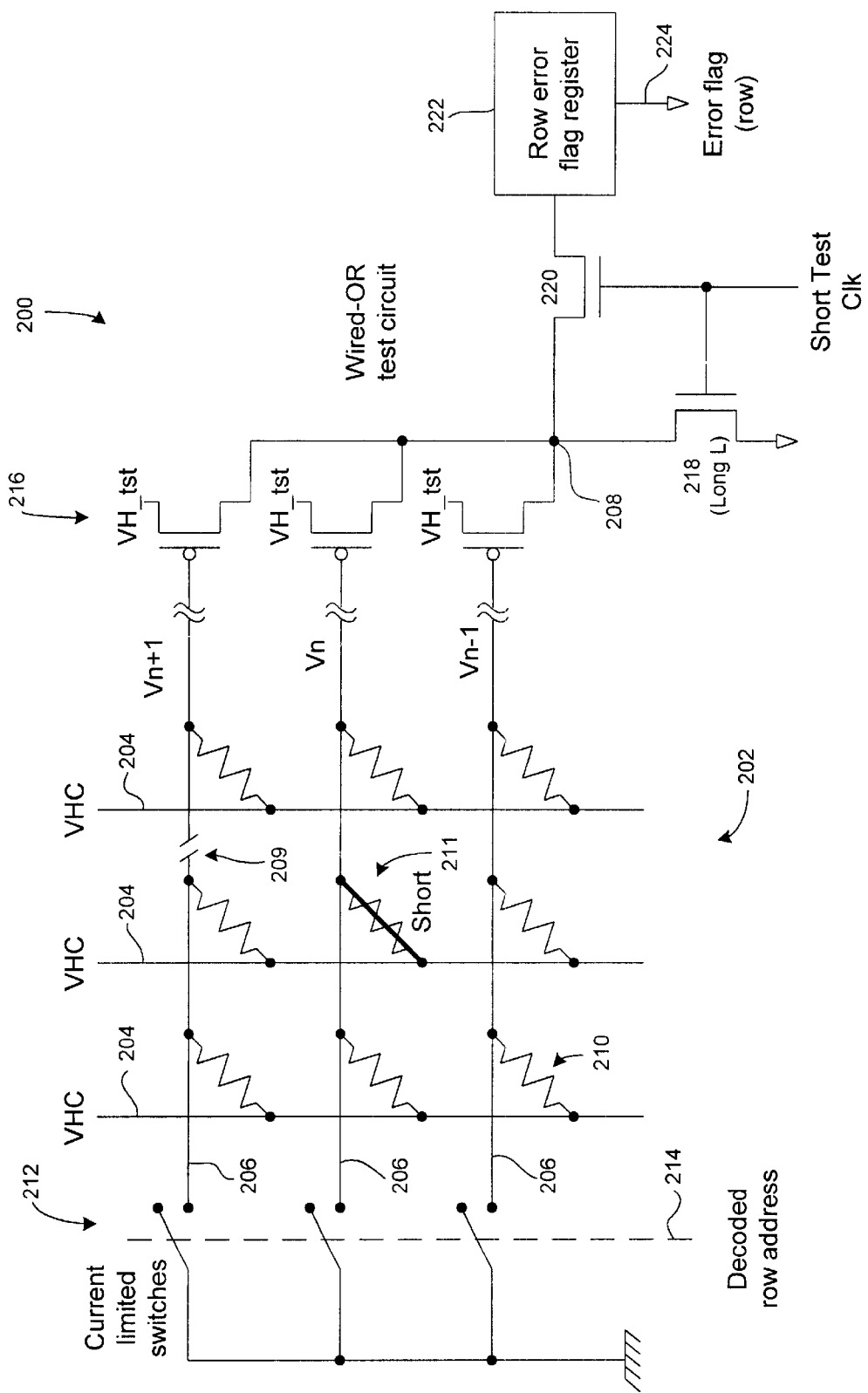
FIG. 2 is a simplified circuit diagram illustrating an open row and shorted MRAM element test circuit.

A simplified circuit 200 is shown in FIG. 2 for testing for open rows and shorted MRAM elements. The circuit 200 shows a portion of an MRAM array 202 which comprises a grid of magneto-resistive memory elements 210 each coupled between respective column control lines 204 and row control lines 206. Three rows are shown in the array portion 202 in FIG. 2, which are referred to as rows "n−1", "n" and "n+1", having row voltage outputs $V_{n-1}$, $V_n$ and $V_{n+1}$, respectively. The row control lines 206 have inputs which are controllably connectable to ground through respective current limited switches 212. The switches 212 are controlled in accordance with a row address input 214, which is operative to selectively close the switches 212 one at a time. The column control lines 204 are supplied with a voltage source VHC.

The control gates of respective wired-OR circuit transistors 216 are coupled to receive the row voltage outputs ($V_{n-1}$, $V_n$, $V_{n+1}$) from the respective row control lines 206. The wired-OR transistors in this instance comprise pMOS transistors each having drain coupled to a voltage source VH_tst. The source terminals of the wired-OR transistors 216 are commonly coupled to an output 208 at the source of a load transistor 218, such as a long channel transistor with a gate controlled by a Short Test Clk signal. The wired-OR output 208 is also coupled through a selection switching transistor 220 to a row error flag register 222. The selection switching transistor 220 is controlled also by the Short Test Clk signal.

The operation of the circuit 200 to detect a shorted memory cell such as shown at 211 is described hereinbelow. Each of the rows of the array 202 is selected in turn, by using the row address input to switch the corresponding current limited switch 212 to couple the row control line 206 to ground. The row selection is timed with the Short Test Clk input signal which controls the output of the wired-OR test circuit. When selected, a good row will pull down the row voltage output (e.g. $V_{n+1}$) and a logic '1' voltage will be presented at the wired-OR output 208 and passed to the row error flag register 222. This is because a each of the memory cells in a good row will have sufficient resistance so that the VHC column voltage does not appear on the row control line. If the row is connected to a very low resistance MRAM cell (e.g. the shorted MRAM cell indicated at 211), the row voltage ($V_n$) will not be pulled down below an error test level so that the corresponding wired-OR transistor 216 will remain "off". In this case a logic '0' voltage will be passed to the row error flag register 222. Un-selected rows will remain at a high (~VHC) voltage, so that the wired-OR output circuit will act only on the row selected by the row address decoder. The row error flag register 222 stores a record of the wired-OR test circuit output for each of the tested rows, and can be constructed, for example, as a shift register which is shifted for each row by the Short Test Clk signal. The row error flag register can thus provide an error flag output 224 which indicates those row(s) which have shorted memory cell(s). As can be appreciated from the foregoing functional description, the circuit 200 will also detect open (e.g. discontinuous) row lines. For example, the same technique described above to detect the shorted memory cell 211 can be used to detect an open fault row line such as shown at 209 in FIG. 2.

Figure 3:
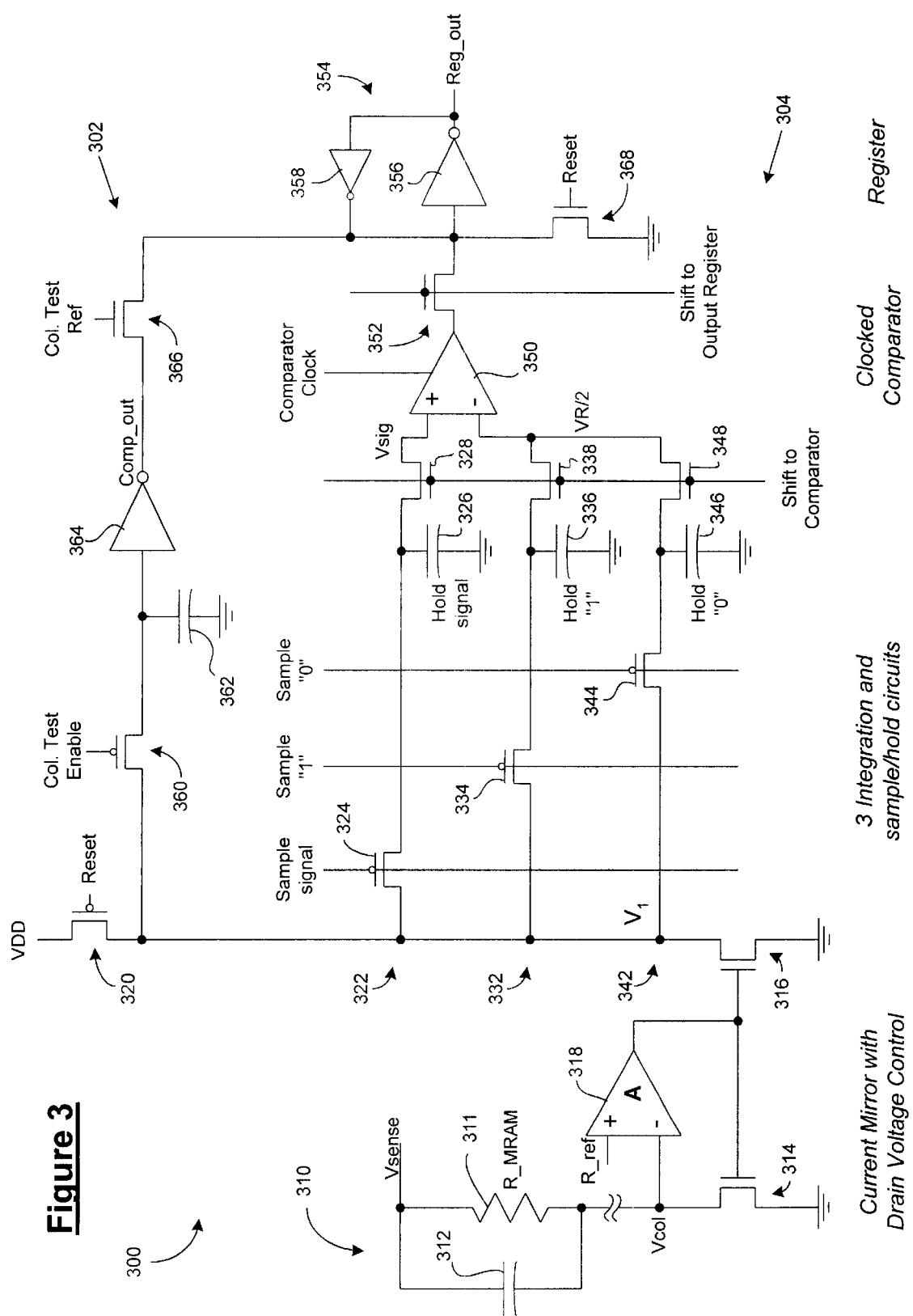
FIG. 3 is a circuit diagram of a Hi/Lo MRAM element resistance test circuit as part of a triple sample sense amplifier.
Figure 4:
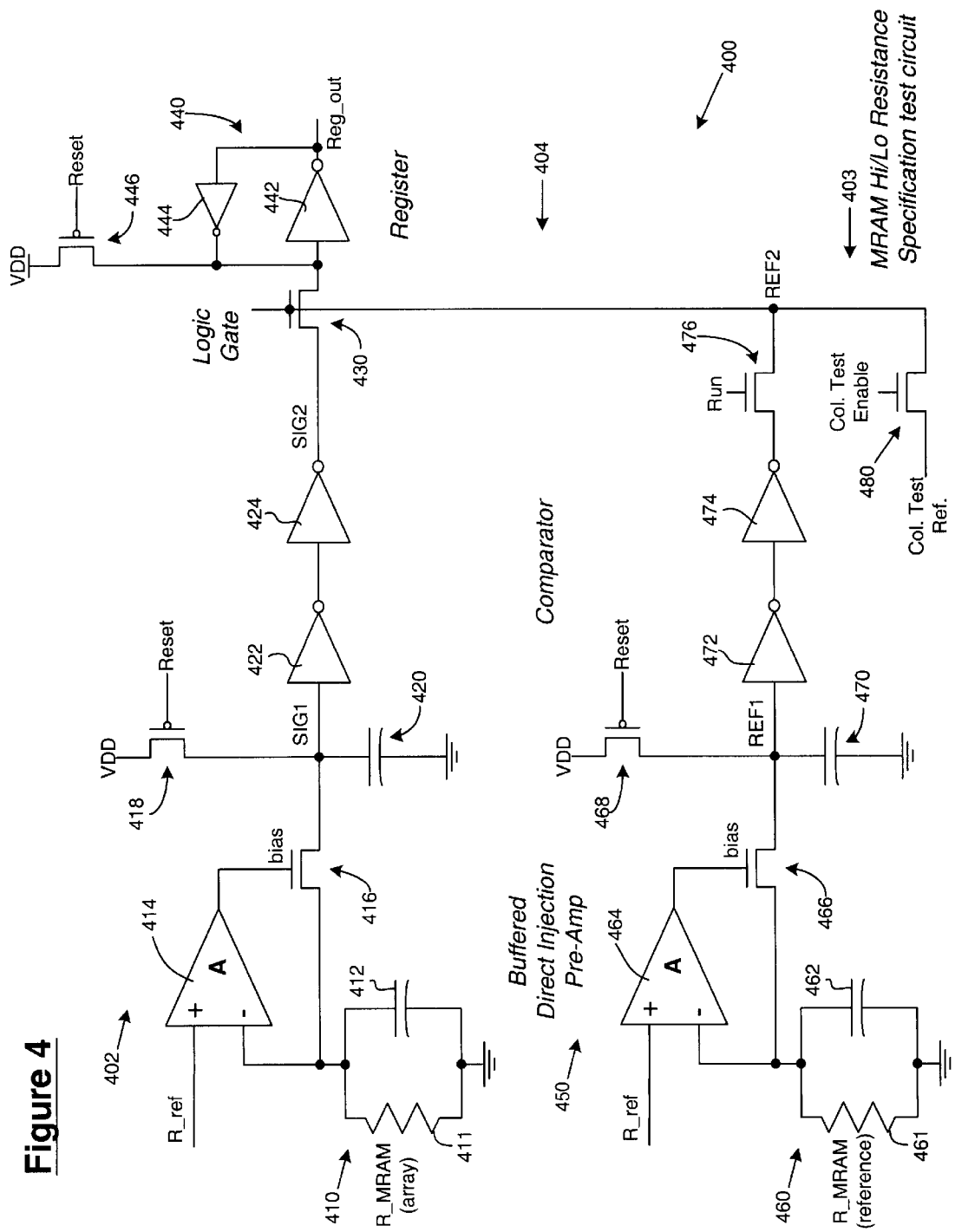
FIG. 4 is a circuit diagram of a Hi/Lo MRAM element resistance test circuit as part of a single sample sense amplifier.

A circuit 300 is illustrated in FIG. 3 showing a Hi/Lo MRAM element resistance test circuit 302 together with a triple sample sense amplifier circuit 304. FIG. 4 illustrates a circuit 400 having a Hi/Lo MRAM element resistance test circuit 403 together with a single sample sense amplifier 404. The test circuits 302 and 403 are designed to detect MRAM element resistance values that are outside the design specifications for the memory element data retrieval process, e.g. are outside of the range of memory element resistance values that can be handled by the sense amplifier circuit. The circuits operate by developing a time signal that is dependent on the resistance of the MRAM element. The MRAM element time signal is compared to a reference time signal supplied by the test support circuits (e.g. the test finite state machine circuitry 112 illustrated in FIG. 1). If the MRAM element is too low of a resistance value, the time signal developed by this 'Lo' resistance element will have an early transition that is sensed by comparing it to a 'Lo' test-reference time signal. Conversely, if the MRAM element is too high of a resistance value, the time signal developed by the 'Hi' resistance will have a late transition that is sensed by comparing it to a 'Hi' test-reference time signal. The results of the 'Hi' and 'Lo' tests are stored in a scan register that is part of the MRAM sense amplifier. Test margins may be set to sort out MRAM elements that have resistance values that will cause the MRAM sense amplifiers to fail. The operation of the circuits 300 and 400 are is described in greater detail hereinbelow.

Referring to FIG. 3, the circuit 300 as illustrated includes a sense amplifier circuit 304 for sensing data from an MRAM cell 310. The MRAM cell 310 is represented by an MRAM resistance R_MRAM 311 in parallel with a capacitance 312. Whilst the MRAM cell 310 represents a single cell from the point of view of the sense amplifier circuit, the actual values of the resistance 311 and particularly the capacitance 312 are influenced by the cell being part of a large array of cells. In a typical storage technology application for the MRAM, the resistance R_MRAM 311 could have a nominal value of about 1 Megohm and the capacitance 312 might be of the order of 0.5 picofarad. One end of the MRAM cell 310 is coupled to the sense amplifier circuit at a node labeled $V_{col}$, and the other end of the cell 310 is supplied with a sensing voltage $V_{sense}$. The $V_{col}$ node is on the input side of a matched transistor current mirror circuit comprising current mirror transistors 314 and 316 and an operational amplifier 318. In particular, the drain of transistor 314 is coupled to node $V_{col}$ and the source thereof to ground. The gate of transistor 314 is coupled to the gate of transistor 316, where the drain and source of transistor 316 are coupled to a node labeled $V_1$ and ground, respectively. The operational amplifier 318 provides drain voltage control for the current mirror circuit using a R_ref signal as input to the positive input node thereof, with the negative input node coupled to $V_{col}$ and the output coupled to the gates of the current mirror transistors 314, 316. In practice, for accurate sensing of the MRAM cell the input voltage $V_{sense}$ is quite small, for example of the order of 0.5 volts, and the voltage at the $V_{col}$ node on the other side of the cell is maintained at a level close to the ground potential using the R_ref input. The function of the current mirror circuit is to maintain a current from node $V_1$ through transistor 316 which is the same as (or a known factor of) the current from node $V_{col}$ through transistor 314. In this way, the current through transistor 316 can be used as a measure of the MRAM cell resistance 311.

A p-type transistor 320 is coupled between the node $V_1$ and supply voltage VDD, and the transistor 320 is controlled by a Reset signal. Four circuit branches are also connected to the node $V_1$, indicated as circuit portions 322, 332, 342 and the resistance test circuit 302 in the figure. The circuit portions 322, 324 and 326 form part of the triple sample sense amplifier circuit 304, and the circuit 302 comprises the MRAM element Hi/Lo resistance test circuit which is included for the purposes of built-in self-testing as discussed above. For the sake of clarity, the operation of the triple sample sense amplifier circuit will be described in order to provide a better understanding of the operation of the test circuit 302.

The circuit portions 322, 332 and 342 can also be referred to as a sample signal circuit (322), a sample "1" circuit (332) and a sample "0" circuit (342). The sample signal circuit 322 has a pass transistor 324 which is coupled between the node $V_1$ and a signal integration node. The pass transistor 324 is controlled by a Sample signal input. The sample signal circuit 322 also has a hold signal capacitor 326 which is coupled between the signal integration node and ground, and together the transistor 324 and capacitor 326 can operate as a voltage integration and sample/hold circuit. The other circuit portions 332 and 342 are similarly constructed. In particular, the sample "1" circuit 332 has a pass transistor 334 which can selectively connect node $V_1$ to or isolate node $V_1$ from a hold "1" integration and hold capacitor 336. The sample "0" circuit 342 also has a pass transistor 344 and an integration and hold capacitor 346. The transistors 334 and 344 are respectively controlled by a Sample "1" input and a Sample "0" input.

The integration node of the sample signal circuit 322 is coupled to the positive input of an operational amplifier 350 by way of a shift transistor 328. Similarly, the integration nodes of circuit portions 332 and 342 are both coupled to the negative input of operational amplifier 350 through respective shift transistors 338 and 348. The shift transistors 328, 338 and 348 are commonly controlled by a Shift to Comparator signal. The operational amplifier has its output coupled to a shift register 354 through another shift transistor 352. The output of the operational amplifier 350 is controlled by a comparator clock input signal, and the shift transistor 352 is controlled by a Shift to Output Register signal. The shift register 354 comprises weak feedback coupled inverters 356 and 358 connected in known manner, and is provided to store the output from the operational amplifier 350. Basically, the operational amplifier 350 operates as a comparator between the signal levels present on the positive and negative inputs, and provides an output accordingly which drives the register 354 to a "1" or "0" state indicative of the sensed state of the MRAM cell. This is described in greater detail below.

The triple sample sense amplifier circuit 304 is a data destructive circuit, which destroys the data stored by the MRAM cell during the sensing procedure. Therefore, after the data has been sensed, the data must be written back to the sensed cell if the data is to be maintained by the MRAM array.

During an initial reset phase of the sense amplifier operation, the Reset signal is applied to turn on transistor 320 which effectively draws node $V_1$ to the supply voltage VDD. During this time the Sample signal input is asserted to turn on transistor 324. This allows the integration and hold capacitor 326 to charge to VDD. The reset transistor 320 is kept on for a period of time to allow the integration capacitors to charge, and this can be accomplished whilst the MRAM array is addressed and the current through the selected MRAM cell 310 is allowed to reach a steady state (up to several micro-seconds). The reset transistor 320 is then turned off for the first, signal sampling, phase of the sense amplifier operation. The reset transistor 320 remains off for the entire sampling operation.

During the first phase of the sense amplifier sampling operation, the Sample signal input is maintained on for a predetermined sampling period. At this time the current through transistor 316 has reached a steady state which mirrors the current through the MRAM cell being sensed. The current through the MRAM cell 310 is of course dependent upon the resistance thereof, which in turn is governed by the state of the data stored in the cell. For example, if a data "0" is stored in the MRAM cell, the resistance value R_MRAM may be proportionally higher than a median resistance value (e.g. by an amount of 5% to 20% for example). The current through transistor 316 depends upon the R_MRAM resistance, and will therefore be larger if MRAM cell stores a "1" than if it stores a "0". The current through transistor 316, with reset transistor 320 off and sample signal transistor 324 on, is drawn from the capacitor 326. The capacitor 326 thus integrates the current drawn through transistor 316 during the sampling period, until the pass transistor 324 is turned off. With transistor 324 off the integrated voltage level is held by the capacitor 326, and represents the data stored by the MRAM cell 310.

In order to determine whether the voltage level on capacitor 326 represents a data "1" or a data "0", the triple sample sense amplifier generates a comparison voltage. The comparison voltage is generated by writing a "1" to the MRAM cell 310 (thereby destroying the previously stored data) and sampling the R_MRAM resistance value, and then writing a "0" to the cell and again sampling. The samples obtained from the known "1" and "0" cell states are combined into an "average" value, which is used to compare against the signal sample. That procedure is described in further detail below.

During a second phase of the sense amplifier sampling operation, a data "1" is written to the MRAM cell 310. Then, the Sample "1" signal is asserted to turn on the transistor 334 for a reset period with transistor 320 turned on to charge the integration capacitor 336 to VDD, and transistor 334 then remains on for a subsequent sampling period. During the sampling period the capacitor 336 integrates current drawn through the mirror transistor 316, and the resulting voltage level on the capacitor 336 therefore represents the resistance of R_MRAM in a known "1" state. Once the transistor 334 is turned off at the end of the second phase sampling period, the "1" voltage is held by capacitor 336.

Similarly, during a third phase of the sense amplifier sampling operation, a data "0" is written to the MRAM cell 310. Then, the Sample "0" signal is asserted to turn on the transistor 344 for a reset period with transistor 320 turned on to charge the integration capacitor 346 to VDD, and transistor 344 then remains on for a subsequent sampling period. During the sampling period the capacitor 346 integrates current drawn through the mirror transistor 316, and the resulting voltage level on the capacitor 346 therefore represents the resistance of R_MRAM in a known "0" state.

Once the transistor 344 is turned off at the end of the third phase sampling period, the "0" voltage is held by capacitor 346.

After the three sampling phases, the integration and hold capacitors 326, 336 and 346 respectively hold voltage levels which respectively represent the sensed original stored data of the MRAM cell 310, a known sensed data "1" and a known sensed data "0". The pass transistors 328, 338 and 348 are then turned on by asserting the Shift to Comparator signal. Because the outputs of circuit portions 332 and 342 are commonly coupled to the negative input node of the operational amplifier 350, the voltage level resulting thereat after assertion of the Shift to Comparator input is an "average" of the known "1" and known "0" voltage levels. This "average" voltage level is referred to as VR/2, and the voltage stored by the signal integration and hold capacitor 326 is referred to as $V_{sig}$.

Upon assertion of the Comparator Clock input to the operational amplifier 350, the operational amplifier provides an output which represents a comparison of the inputs $V_{sig}$ and VR/2. For example, if the signal voltage level $V_{sig}$ is greater than the "average" voltage level VR/2, the output of the operational amplifier 350 is a relatively high voltage. Conversely if $V_{sig}$ is less than VR/2 then the op-amp output is relatively low. Then, the Shift to Output Register signal is asserted, turning on transistor 352, which allows the op-amp 350 output to drive register cell 354. Accordingly, if the output of op-amp 350 is relatively low, the register cell stores a data "1" (the register cell output Reg_out is at the output of inverter 356). If the output of op-amp 350 is relatively high, the stored output of the register cell 354 is a data "0". The structure of the register cell 354 is such that the value stored therein will remain, by virtue of a weak feedback inverter 358, until an input to the register is provided which overpowers the inverter 358.

The Hi/Lo MRAM cell resistance test circuit 302 is also coupled to the node $V_1$, and uses the mirrored current through transistor 316 as input. The test circuit 302 operates using two inputs which are supplied from the testing FSM circuitry 112 referred to in FIG. 1. The first input is a Column Test Enable signal which controls a pass transistor 360. The pass transistor 360 couples the test circuit 302 to the node $V_1$, and can be controlled by the Column Test Enable signal to selectively connect or disconnect a test integration and hold capacitor 362 to the node $V_1$. The integration and hold operation of the transistor 360 and capacitor 362 is generally similar to the operation of the equivalent functions of the circuit portions 322, 332, 342. However, the test circuit 302 operates separately from circuit portions 322, 332 and 342, and therefore transistor 360 is switched on to the exclusion of the sampling pass transistors 324, 334, 344 (and vice versa), so that the sense amplifier sampling functions do not interfere with the operation of the test circuit 302.

The test circuit 302 operates in two separate phases, one for determining if the cell resistance R_MRAM is too high and another to determine if it is too low. The principle of the test circuit 302 operation is a comparison of the time required for charge integration due to current through transistor 316 to reach a predetermined voltage level with predetermined time limits. An inverter 364 is coupled to the integrating node of the capacitor 362, and operates in the mode of a threshold device to set the predetermined voltage level. The output of inverter 364 is coupled through a pass transistor 366 to the shift register cell 354 which is used to store a comparison result. The input signal Column Test Reference to the pass transistor 366 is used to apply the aforementioned predetermined time limits. A reset transistor 368 is coupled between the input node to the register cell 354 and ground, which can be controlled for example by the inverted Reset signal used for transistor 320 in order to initialize the register cell 354 to a known state at the beginning of testing.

During a first testing phase of the test circuit 302, the Reset and Column Test Enable signals are initially asserted so that the capacitor 362 can be charged to a level approaching supply voltage VDD. Then, the reset transistor 320 is turned off, and the voltage across capacitor 362 is allowed to integrate charge according to the current through transistor 316 (which is inversely proportional to the resistance R_MRAM being measured). In general, if the resistance R_MRAM is relatively low then the voltage at the input of the inverter 364 will reach the inverter switching threshold sooner during charge integration than if R_MRAM is relatively high. The first phase of testing is to determine if the output of the inverter makes a transition too early, indicating an R_MRAM value that is too low. The second phase of testing determines if the output of the inverter makes a transition before it is too late, which indicates that the R_MRAM value is not too high. The second testing phase is only carried out if the MRAM cell passes the test of the first phase. In order to gain a better understanding of the testing procedure it is useful to refer to FIG. 5, which is a timing diagram illustrating the relative timing of relevant signal levels from the test circuit 302.

Figure 5:
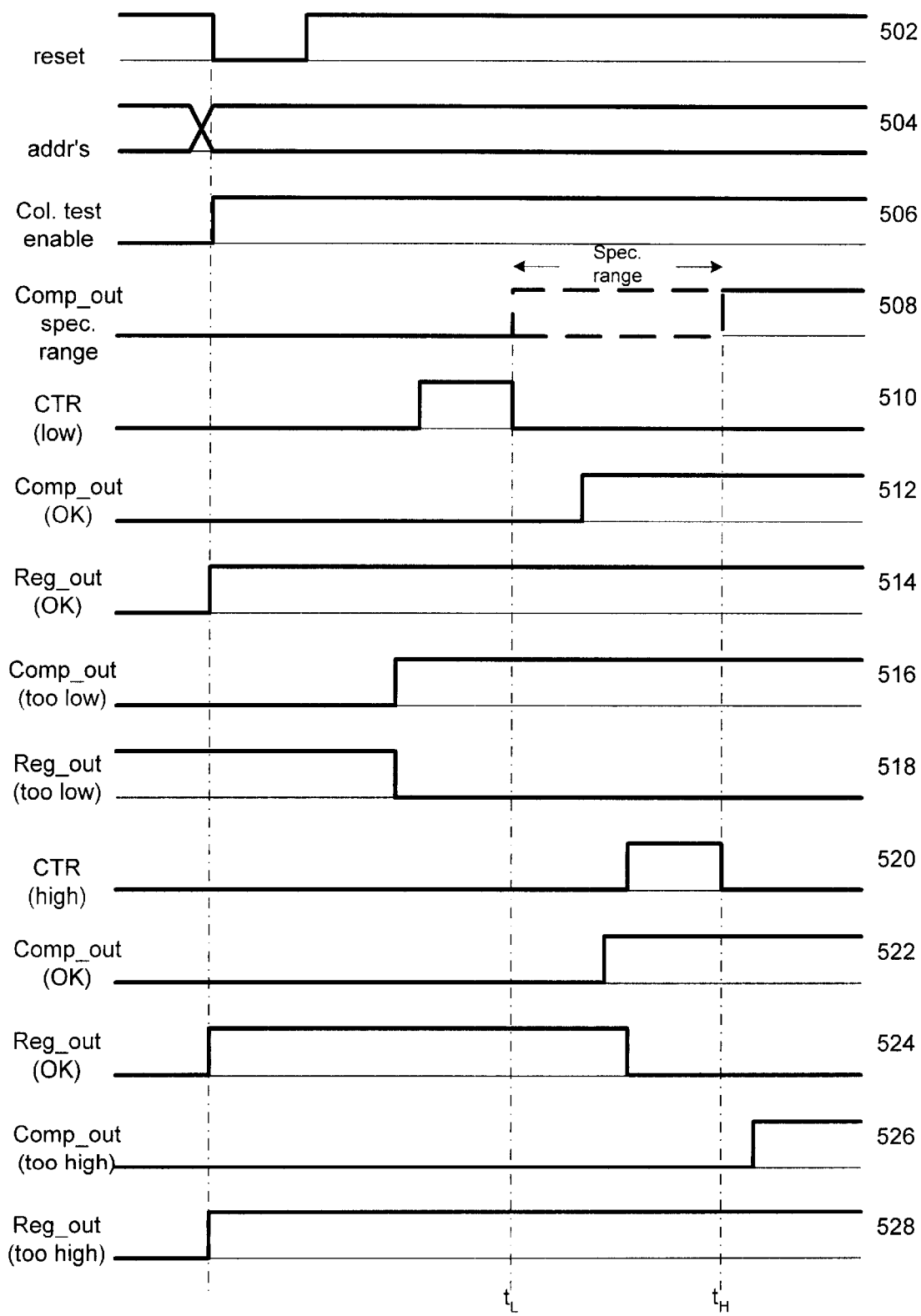
FIG. 5 is a timing diagram illustrating a Hi/Lo MRAM element resistance test timing sequence.

FIG. 5 shows several voltage signal representations indicating the relative timing thereof. The input Reset signal is indicated at 502, MRAM array addressing inputs are indicated at 504, and the Column Test Enable input is indicated at 506. A time range for transitions of the output, Comp_out, of the inverter 364 which is within specification limits is indicated at 508. The lower end of the time range is time $t_L$, and if during testing the transition of Comp_out for a given MRAM cell occurs before $t_L$ then that cell is considered to have a resistance R_MRAM value that is too low. The upper end of the time range is time $t_H$, and if during testing the transition of Comp_out for a given MRAM cell occurs after $t_H$ then that cell is considered to have a resistance R_MRAM value that is too high.

In order to test whether R_MRAM is too low, the Column Test Reference signal is controlled so that transistor 366 is turned off at time $t_L$, as indicated at 510. In this case the transistor 366 is maintained in the on state for a period preceding time $t_L$, as shown in the figure. The length of time that Column Test Reference is asserted need only be sufficient for the output Comp_out of the inverter 364 to drive the register cell 354.

According to this phase of the testing, if the resistance R_MRAM is within the specified range, the following effects occur:

i) the current through transistors 314 and 316 is within acceptable range;
ii) the voltage at the integration node of capacitor 362 decays from VDD at an acceptable rate; and
iii) the inverter output Comp_out is not driven from low to high before time $t_L$; and so
iv) the value stored in register cell 354 following time $t_L$ remains the same as the value preset using transistor 368 (i.e. for time>$t_L$, Reg_out="1"); and
v) because the transistor 366 is turned off at time $t_L$, any transition occurring at Comp_out after $t_L$ does not affect the register output Reg_out.

Accordingly, for an MRAM cell 310 that has a resistance value R_MRAM that is higher than a specified lower limit, the register cell output Reg_out is "1" after the Column Test Reference signal has been driven low (i.e. after $t_L$). Examples of signal representations for Comp_out and Reg_out in the case of an MRAM cell with resistance that meets the lower limit specification are shown at 512 and 514, respectively.

The same testing output as an acceptable cell is obtained in the first testing phase if the MRAM cell resistance is too high. Therefore if the MRAM cell passes testing in the first phase it is necessary to carry out the second phase testing to determine if R_MRAM is too high. If the MRAM cell fails the first phase test then it is not necessary to continue the testing, since a cell has already failed and in any event cannot have resistance that is both too high and too low. For consistency of procedure, however, the second phase test maybe carried out anyway, and the result ignored.

On the other hand, if the resistance R_MRAM is lower than the specified range, the following effects occur:

i) the current through transistors 314 and 316 is higher than acceptable;
ii) the voltage at the integration node of capacitor 362 decays from VDD at a faster than acceptable rate; and
iii) consequently the inverter output Comp_out is driven from low to high before the lower time limit $t_L$; and so
iv) the input to register cell 354 is driven high through open pass transistor 366 before the pass transistor is closed at time $t_L$; and
v) after the transistor 366 is turned off at time $t_L$, the register output Reg_out is "0", which differs from the preset "1" value.

Accordingly, for an MRAM cell 310 that has a resistance value R_MRAM that is lower than a specified lower limit, the register cell output Reg_out is "0" after the Column Test Reference signal has been driven low (i.e. after $t_L$). Examples of signal representations for Comp_out and Reg_out in the case of an MRAM cell with resistance that does not meet the lower limit specification are shown at 516 and 518, respectively.

In order to test whether R_MRAM is too high, the Column Test Reference signal is controlled so that transistor 366 is turned off at time $t_H$, as indicated at 520. In this case the transistor 366 is maintained in the on state for a period preceding time $t_H$, as shown in the figure. The length of time that Column Test Reference is asserted need only be sufficient for the output Comp_out of the inverter 364 to drive the register cell 354.

For the second phase resistance specification test, if the MRAM cell resistance is within lower than the upper specification limit then the Comp_out signal transition will occur within the time period $t_L$ to $t_H$ as indicated at 522. Then, while the Column Test Reference signal 520 is asserted, the inverter output will drive the initially high Reg_out output of the register cell 354 to a low ("0") level, as seen at 524. For an MRAM cell with a resistance that is too high, the Comp_out transition does not occur before pass transistor 366 is turned off, and therefore Reg_out remains at a high ("1") level in that case (see 526 and 528 in FIG. 5). As a result, an MRAM cell that has resistance that is too high will return Reg_out="1" following the second phase test. On the other hand, an MRAM cell with resistance lower than the specified upper limit will return a second phase testing result of Reg_out="0".

Combining the first and second phase tests, an MRAM cell can be judged as having acceptable resistance only if the first test result returns Reg_out(1)="1" AND the second test result returns Reg_out(2)="0". Any other combination of first and second phase testing results indicates that the resistance value of the MRAM cell under test is unacceptable as being outside of the tolerable resistance specifications. The test results can be compared against the predetermined acceptable results by the test FSM 112 (FIG. 1), or using simple logic circuitry (not shown). The test results for cells in a given column of the MRAM array may also be counted by the Column Error Counter 110 shown in FIG. 1.

FIG. 4 illustrates a single sample MRAM sense amplifier circuit 400 which includes provision for high and low resistance specification testing. The basic operation of the single sample sense amplifier circuit relies on a reference circuit with preset tolerances which is used to compare against the MRAM cell being sensed. The detailed operation of the circuit 400 is described hereinbelow.

The single sample sense amplifier circuit 400 comprises two primary circuit portions: a reference circuit 450 and a signal circuit 402. As can be seen in FIG. 4, the reference circuit and signal circuit are generally similar in structure, and each comprise a pre-amplifier stage and a comparator stage. The single sample sensing circuit 400 utilizes a buffered direct injection pre-amplifier stage, in contrast to the current mirror stage employed in the triple sample sensing circuit described above. Regarding the signal circuit 402, an MRAM cell to be sensed (410) is coupled to the sensing circuit at the negative input of an operational amplifier 414. As described hereinabove, the MRAM cell can be considered as a resistive element R_MRAM (array) 411, in parallel with a capacitive element 412. The operational amplifier 414 is has its positive input coupled to receive an R_ref control signal, as in the previously described sensing circuit, which can be used to control the bias of the direct injection transistor 416. The transistor 416 couples the pre-amplifier stage to the input node, labeled SIG1, of the comparator stage of the signal circuit 402.

The pre-amplifier stage of the reference circuit 450 is structured the same as that of the signal circuit 402. An MRAM cell 460 is coupled to an operational amplifier 464 which controls the bias of a direct injection transistor 466. In the reference circuit, however, the MRAM cell 460 is not an MRAM array storage cell but is an MRAM cell provided specifically for a reference comparison. The MRAM cell 460 has a resistive element R_MRAM (reference) 461, which has a nominal MRAM resistance value. The reference MRAM cell is preferably fabricated in the same way as the MRAM cells in the array being sensed, which facilitates the matching of the capacitance values 412 and 462. The direct injection transistor 466 couples the reference MRAM cell to the input node of the reference circuit comparator stage, labeled REF1.

Referring again to the signal circuit 402, the input to the comparator stage has an integrating capacitor 420 coupled between the input node SIG1 and ground. The input node SIG1 also has a reset circuit coupled thereto, in the form of a p-type transistor 418 coupled between SIG1 and voltage source VDD and controlled by a Reset signal. The node SIG1 is furthermore coupled to the input of a first inverter 422. The output of the first inverter 422 is coupled to the input of a second inverter 424. The output of the second inverter provides an output node for the comparator stage, labeled SIG2. The output node SIG2 of the signal circuit is coupled to the input of a register cell 440 through a logic gate pass transistor 430. The register cell 440 is generally equivalent to the register cell 354 of circuit 300 described hereinabove. The logic gate pass transistor 430 is controlled by the output of the reference circuit 450, as described below.

The comparator stage of the reference circuit 450 has substantially the same structure as the comparator stage of the signal circuit. In particular, input node of the reference circuit comparator stage, REF1, is coupled to an integrating capacitor 470, a reset transistor 468, and the input to a first inverter 472. The output of first inverter 472 provides the input to a second inverter 474. The output of second inverter 474 provides the output of the reference circuit 450 at node REF2, through a pass transistor 476 which is controlled by a Run control signal. The output node REF2 controls the aforementioned logic gate pass transistor 430.

As mentioned, the register cell 440 has generally the same structure as the register cell 354 previously described, with a storage inverter 442 and weak feedback inverter 444. In this case the register cell 440 can be placed in a predetermined state by way of a reset pull-up transistor 446 controlled by the Reset signal.

The single sample sensing circuit 400 operates somewhat like a signal race between the signal circuit 402 and the reference circuit 450. The reference circuit 450 controls the pass transistor 430, and if the signal circuit 402 "wins" the race then the output at SIG2 is able to change the state of register cell 440 before the pass transistor 430 is turned off. On the other hand, if the reference circuit 450 "wins" then the transistor 430 is turned off before the register cell is changed.

At the beginning of the sensing procedure both of the integrating nodes SIG1 and REF1 of capacitors 420 and 470 are raised substantially to voltage VDD by pulsing control signal Reset. This also has the effect of resetting the register cell 440 by pulling the input thereof high thereby providing an initial state of the register cell output Reg_out="0". The pass transistor 476 is kept open by asserting the Run signal while the sensing circuit is in operation. The Run signal is turned off for the purposes of the built-in self testing which is described further below. With the REF1 and SIG1 nodes charged to VDD the output nodes REF2 and SIG2 are also high, which means that logic gate pass transistor 430 is open and the register output Reg_out remains low (logic "0"). When the Reset signal is turned off, the pre-charged capacitors 420 and 470 begin to integrate by discharging current through the respective R_MRAM resistive elements 411 and 461. When the voltage at the integration node SIG1 reaches the threshold voltage of the first inverter 422, the output of that inverter will change, causing the output node SIG2 to change from the initial logic "1" state to a logic "0" state. The time at which that transition takes place depends upon the capacitance of the integrating capacitor 420, and also on the integration rate which is affected by the value of array resistance R_MRAM 411. The value of R_MRAM 411 is variable according to the stored state thereof, and therefore the state of the array MRAM cell 410 affects the timing of the SIG2 transition.

Because the reference circuit 450 is constructed similarly to the signal circuit 402, the initial state of output node REF2 is also logic "1". The timing of the transition of REF2 from a logic "1" to a logic "0" state is affected by the capacitance 470 and resistance R_MRAM 461 of the reference MRAM cell 460. The reference cell 460 is not programmable as the MRAM cells of the array are, and the value of the resistance 461 is therefore fixed. The capacitance value of capacitor 470 is also fixed, as is the value of capacitor 420. Accordingly, the relative timing of the transitions of output nodes SIG2 and REF2, for given values of capacitors 420 and 470, is governed by the programmed resistance of R_MRAM (array) 411. The relative values of capacitors 420 and 470 can thus be chosen so that for a first state of MRAM cell 410 the transition of SIG2 occurs before REF2, and for a second state of cell 410 the transition of SIG2 occurs after REF2. This means that in the first state of cell 410, the transition of SIG2 causes a transition of register output Reg_out from "0" to "1", and in the second state of cell 410 Reg_out remains at logic "0". Thus the state of the sensed MRAM cell is indicated by the register cell output Reg_out. It will be noted that this sensing scheme is not data destructive as in the case of the triple sample sensing procedure.

In the case of the single sample sensing circuit 400, the functionality of high/low resistance specification testing can be added using a single pass transistor 480. The testing pass transistor 480 couples a control input Column Test Reference to the gate of the logic gate transistor 430 at node REF2. The testing transistor 480 is turned on or off by another control signal Column Test Enable. Both of the control signals Column Test Reference and Column Test Enable can be provided by control circuitry, such as the Test FSM 112 referred to in FIG. 1. The signal Column Test Enable and Run signal are controlled so that only one of the transistors 476 and 480 are turned on at a time. This means that when transistor 480 is on, node REF2 can be controlled by the Column Test Reference signal without interference from the reference circuit 450. The Column Test Reference signal is controlled as described below in order to determine whether the R_MRAM (array) resistance 411 is within specified limits.

With the testing transistor 480 enabled, the testing procedure for controlling Column Test Reference signal to determine if the resistance R_MRAM 411 is within specifications is similar to that described above for controlling the transistor 366 in circuit 302. A first testing pulse is applied during a sensing cycle of the signal to circuit 402 to determine if the cell resistance is too low. The end of the first pulse corresponds to the timing of a transition of SIG2 which is on the lower limit of acceptability, therefore corresponding to a lower specified limit of cell resistance. If, following the first testing pulse, the output Reg_out remains at "0", the resistance of element 411 is judged to be greater than the specified lower limit. Then, a second testing pulse is applied to the Column Test Reference signal during another sensing cycle of the circuit 402. The end of the second testing pulse is timed to coincide with the timing of a transition of SIG2 which is on the upper limit of acceptability, therefore corresponding to an upper specified limit of cell resistance. If, following the second testing pulse, the output Reg_out has changed to "1", the resistance of element 411 is judged to be less than the specified upper limit. Thus, if the result of the first testing cycle is Reg_out="0" and the second testing cycle is Reg_out="1", the MRAM cell 410 is determined to have a nominal resistance value that is within the specified acceptable limits. The relative timing can be easily ascertained having reference to the timing diagram of FIG. 5 as described above.

The circuits illustrated in FIGS. 3 and 4 and described hereinabove are specific examples of analog sense amplifiers which are configured to perform Hi/Lo resistance testing according to particular embodiments of this invention, and this method of sensing Hi and Lo resistance will work with other types of sense amplifiers also. In particular, it is envisaged that the described techniques for sensing Hi and Lo resistance limits are applicable to any integrating sense amplifier, including both analog and digital sense amplifiers.

A third set of built-in self tests are the conventional pattern tests. Patterns of all "1"s, all "0"s, alternating "0"–"1"s and "1"–"0"s are written to and then read from the MRAM array. The pattern is written into the entire array and then read, row by row. During the row reading process, the pattern value is asserted as an input to a exclusive-OR circuit and compared to the value detected by the sense amplifier, the result is stored in the sense amplifier data I/O scan register.

Figure 6:
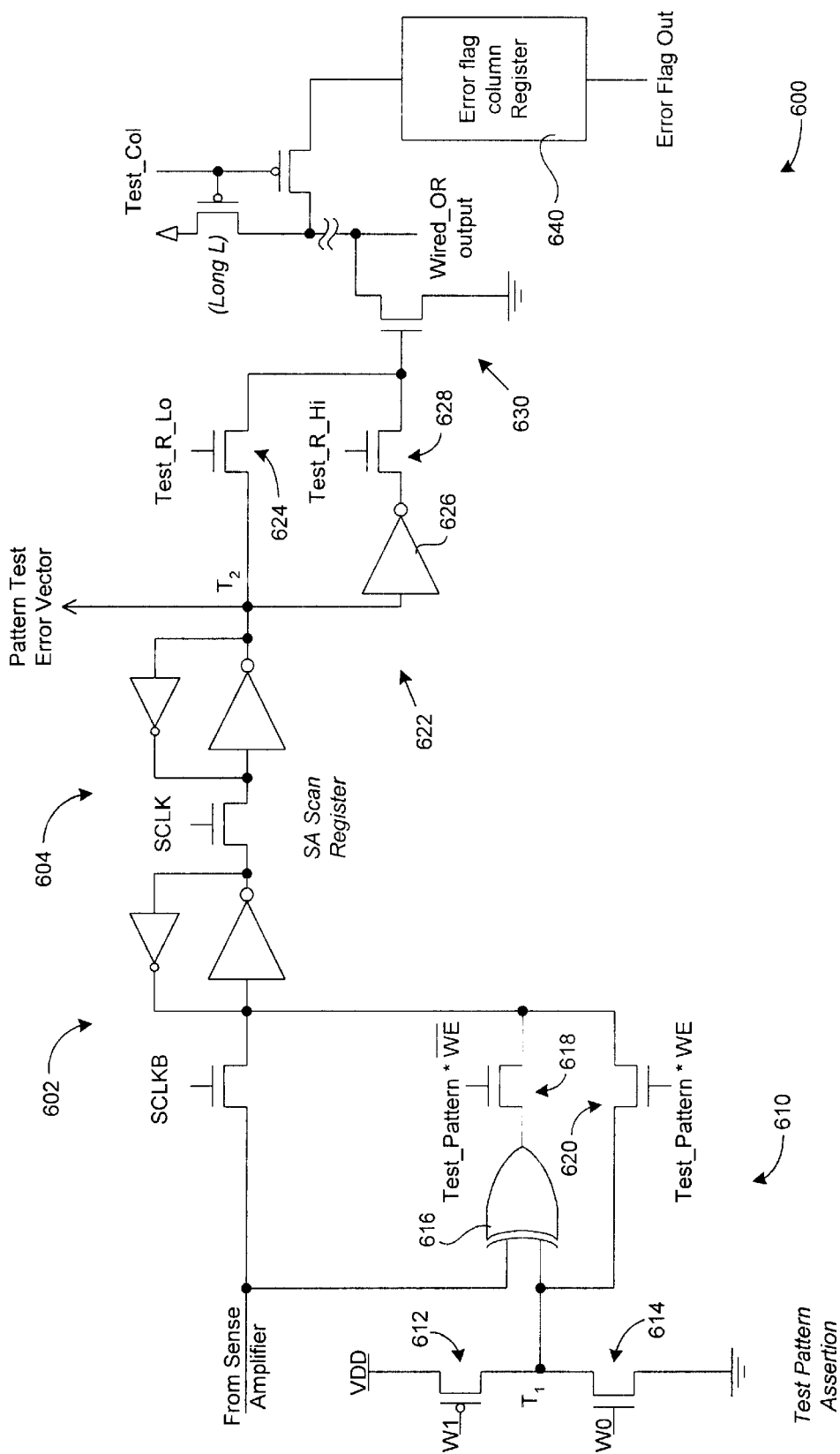
FIG. 6 is a simplified circuit diagram of a column Hi/Lo resistance test and pattern test wired-OR circuit.

Errors detected by the Hi/Lo resistance test or by the pattern tests are stored in the sense amplifier data I/O scan registers. An error flag is reported for the entire row if one or more errors have been detected. The circuit 600 shown in FIG. 6 can be used to monitor all the sense amplifier data I/O scan registers and combine the data with a wired-OR circuit. Two paths are indicated to connect the sense amplifier data I/O scan registers to the wired-OR circuit, one through an inverter and one straight connection to account for the mode of error reporting of the resistance specification tests described above.

The circuit 600 as shown has two sense amplifier scan register cells 602 and 604 which are arranged in shift registers fashion clocked by shift clock signals SCLK and SCLKB. The first of the scan registers, 602, receives input from an MRAM sense amplifier circuit, such as a single or triple sample sense amplifier of the type described hereinabove in relation to FIGS. 4 and 3, respectively.

Also coupled to the input of the first scan register is a pattern testing circuit 610. The pattern testing circuit 610 has a test pattern assertion portion comprising transistors 612 and 614 which are arranged to respectively pull-up or pull-down an input node $T_1$ to represent a test pattern input "1" or "0". The pull-up and pull down transistors are controlled by input write signals W1 and W0. The node $T_1$ is connected both a test pattern read circuit and a test pattern write circuit. The test pattern read circuit comprises an exclusive-OR gate 616 which is connected in series with a pass transistor 618. The inputs of the exclusive-OR gate are provided from the sense amplifier and the node $T_1$. The output of the test pattern read circuit from the pass transistor 618 is in turn connected back at the input of the scan register. The clocking transistor controlled by CLKB separates the input and output of the pattern testing circuit 610. The test pattern write circuit comprises another pass transistor 620 that is connected in parallel with the test pattern read circuit from node $T_1$ to the input of the scan register.

The test pattern write and read circuits are able to be coupled in parallel in view of the way in which data is input to and output from an MRAM array with the scan register. In short, the scan register is used for both input and output of data. The control signals to the pass transistors 618 and 620 are mutually exclusive so that only one of the test pattern write and read operations can be enabled at one time. During a write operation, pass transistor 620 is enabled, and a selected binary state is asserted using one of the pull-up and pull-down transistors 612, 614. This allows the selected pattern to be written into the relevant MRAM cell through the scan register I/O in standard manner. Then, the MRAM cell is read through the sense amplifier circuit as above described, and the sensed binary level appears at the input to the circuit 610. The exclusive-OR gate 616 detects any differences between the data that was written and the data that was read, and the result of the pattern test is stored in the scan register when the pass transistor 618 is enabled.

The output of the scan register cell 604 in circuit 600, at node $T_2$, may be coupled in a chained circuit manner to the input of the scan register circuit of the next column of the array. The chained scan registers can thus store a pattern test error vector which can be utilized by the Column Error Counter 110 (FIG. 1), for example.

As will be appreciated from the foregoing description, the node $T_2$ at the output of the scan register in circuit 600 will receive the built-in self-test results of both of the above described resistance specification testing and pattern tests, as the individual tests are carried out. To allow all of the test results to be registered, the test results provided from the scan register output in circuit 600 are coupled into a column wired-OR test circuit 630 which is of similar structure to the row wired-OR circuit described in relation to FIG. 2. The column wired-OR circuit 630 is controlled by a Test_Col input signal which only enables output of the wired-OR circuit to an Error Flag Column Register 640 when the row under consideration is selected, e.g. by the Test FSM 112 (FIG. 1).

In between the node $T_2$ and the column wired-OR circuit 630 is a selection circuit 622 which is used to ensure consistency or error reporting from the self-test circuits. The selection circuit 622 has a first circuit arm which comprises a pass transistor 624. The pass transistor 624 is enabled when the particular self-test being carried out returns a logic "1" if the MRAM cell passes the test. A second circuit arm of the selection circuit has an inverter 626 coupled in series with a pass transistor 628. The second circuit arm of the selection circuit 622 is enabled if the particular test being carried out has an expected pass result of logic "0". The selection circuit 622 allows MRAM cell errors detected by the testing circuitry to be consistently recorded in the Error Flag Column Register 640, which can be incorporated into the Test FSM (FIG. 1).

Errors reported by the column test circuits may be single bit errors that are correctable by ECC (Error Correction Circuits) or may be multiple bit errors that warrant the row being marked as a 'BAD' row. A counter is used to determine whether there are a sufficient number of errors for marking the row 'BAD'. If the column error flag indicates an error condition exists, the data in the sense amplifier data I/O scan registers is shifted into the column error counter (110 in FIG. 1). When the row error count exceeds a value determined as un-correctable by an external ECC, the row may be marked as 'BAD'. Error data created by the built-in self test circuits may be collected by external circuits for future processing or reported to the tester. One external circuit to hold the built-in self test data is a 'status register' that would be used by the system using the MRAM to direct the writing of data into known good memory locations.

The preferred implementation of the present invention involves several integrated built-in test circuits that can be used to perform a comprehensive set of tests to locate defects in a MRAM memory array. Shorted elements and open rows can be detected with the use of row wired-OR test circuit. Dynamic Hi/Lo memory cell resistance tests are carried out through the use of specially constructed sense amplifier circuits. Pattern tests can be performed with the use of exclusive-OR circuits integrated into the sense amplifiers and using the scan data I/O registers. Outputs from the Hi/Lo and pattern tests examine the performance of individual MRAM memory elements. A wired-OR circuit is used to combine the Hi/Lo and pattern tests results into a single column error flag. If the column error flag is set, an error test counter is included to count the number of cells in a row the are marked as BAD. The column error count may be used to determine if the row of data is ECC correctable.

Based on the detailed description of the functions of the present invention and the preferred embodiments thereof, including the requirements of the controlling signals utilized by some of the circuits, it is within the capabilities of a person of ordinary skill in the art to construct a controlling circuit such as the Test FSM circuit 112 shown in block form in FIG. 1. The controlling circuit can be constructed in any desirable form in order to provide the control signals discussed and described in detail hereinabove, and those skilled in the field of built-in testing for integrated circuits will readily recognize the desirability of maintaining the silicon area required for the circuitry at a minimum, for example.

The foregoing detailed description of the invention has been presented by way of example only, and it is contemplated that changes and modifications may be made by one of ordinary skill in the art, to the specific and arrangements of elements of the present invention without departing from the scope of the invention. For example, although several specific circuits are illustrated and described in order to provide an understanding of the principles of the invention, the present invention is not limited to those structures.

We claim:

1. A built-in self testing system for a magneto-resistive memory array integrated circuit, comprising:
    a first resistance specification testing circuit coupled to the bitlines of the memory array for testing the resistance of each memory cell in the memory array to determine if the resistance thereof is within predetermined upper and lower limits;
    wherein the resistance specification testing circuit compares a signal generated from each respective memory cell with first and second predetermined timing signals representing the predetermined upper and lower memory cell resistance specification limits.

2. A built-in self testing system as claimed in claim 1, wherein the resistance specification testing circuit is incorporated in sense amplifier circuitry of the integrated circuit.

3. A built-in self testing system as claimed in claim 2, wherein the resistance specification testing circuit includes a charge integrating circuit arranged to integrate charge according to sensing current through a memory cell under test, a threshold circuit coupled to provide a binary output from the integrating element, and a switching circuit coupled to provide said binary output to a scan register of the sense amplifier in accordance with said first and second predetermined timing signals.

4. A built-in self testing system as claimed in claim 2, further comprising a second testing circuit coupled to a scan register of the memory array and arranged to write a predetermined data pattern into the memory array, read out data from the memory array, and compare the data out with the data written in.

5. A built-in self testing system as claimed in claim 4, wherein the second testing circuit is coupled with the first testing circuit through a wired-OR circuit to combine the outputs thereof into an error flag column register.

6. A built-in self testing circuit as claimed in claim 5, wherein the error flag column register records a number of errors detected by the first and second testing circuits for each row in the memory array in order to determine if the number of errors for each respective row is greater than a predetermined permissible number.

7. A built-in self testing system for a magneto-resistive memory array integrated circuit, comprising:
    a first resistance specification testing circuit coupled to the bitlines of the memory array for testing the resistance of each memory cell in the memory array to determine if the resistance thereof is within predetermined upper and lower limits;
    a second testing circuit coupled to the rows of memory cells in the memory array and arranged to detect shorted memory cells and open row addressing lines in the respective array rows.

8. A built-in self testing system as claimed in claim 7, wherein the second testing circuit comprises a wired-OR circuit coupled with the memory array rows to provide input and coupled to provide output to a row error flag register which records if any shorted cell or open row addressing line is detected in the memory array.

9. A built-in self testing system for a magneto-resistive random access memory (MRAM) integrated circuit having an array of memory cells, the memory cells each coupled between a respective row line and column line of the array, with sense amplifiers being coupled to the column lines of the array to sense data stored in the memory cells and a scan register coupled to receive output from the sense amplifiers and provide input for the memory cells in the array, the built-in self-testing system comprising:

- a first testing circuit comprising a resistance specification testing circuit coupled to the respective sense amplifiers for testing the resistance of each memory cell in the memory array to determine if the resistance thereof is within predetermined upper and lower limits;
- a second testing circuit coupled to the row lines of the memory array for detecting shorted memory cells and open row addressing lines in the respective array rows; and
- a third testing circuit coupled to the scan register of the memory array and arranged to write a predetermined data pattern into the memory array, read out data from the memory array, and compare the data read out with the data written in.

10. A built-in self testing system as claimed in claim 9, further comprising a testing state machine circuit coupled to control the first, second and third testing circuits to carry out respective first, second and third tests on the memory array.

11. A built-in self testing system as claimed in claim 10, wherein the second testing circuit comprises a wired-OR circuit coupled to receive input from the memory array row lines and coupled to provide output to a row error flag register which records if any shorted cell or open row addressing line is detected in the memory array.

12. A built-in self testing system as claimed in claim 10, wherein the third testing circuit is coupled with the first testing circuit through a wired-OR circuit to combine the outputs thereof into an error flag column register.

13. A built-in testing system as claimed in claim 12, wherein the error flag column register records a number of errors detected by the first and third testing circuits for each row in the memory array in order to determine if the number of errors for each respective row is greater than a predetermined permissible number.

14. A built-in self testing system as claimed in claim 10, wherein the resistance specification testing circuit compares testing signals generated in the sense amplifiers corresponding to each respective memory cell with first and second predetermined timing signals representing the predetermined upper and lower memory cell resistance specification limits so as to generate an error flag signal if the testing signal for a memory cell in the array is outside of the first and second predetermined timing signal limits.

15. A built-in self testing system as claimed in claim 14, wherein the first and second predetermined timing signals are generated by said testing state machine circuit.

16. A built-in self testing system as claimed in claim 15, wherein the resistance specification testing circuit includes a charge integrating circuit arranged to integrate charge according to sensing current through a memory cell under test, a threshold circuit coupled to provide a binary output from the integrating element, and a switching circuit coupled to provide said binary output to the scan register in accordance with said first and second predetermined timing signals.

17. A method for providing a built-in self testing capability for a magneto-resistive random access memory (MRAM) integrated circuit having an array of memory cells with at least one sense amplifier for sensing data stored in the memory cells, comprising:

- using the sense amplifier to generate a current signal representing a sensing current through a memory cell in the array;
- time integrating the current signal and applying a threshold thereto to produce a binary output;
- sampling the binary output at first and second times; and
- registering the memory cell as outside predetermined resistance specifications based on the first and second sampled binary outputs.

* * * * *